(12) United States Patent
Zeng et al.

(10) Patent No.: US 9,917,344 B2
(45) Date of Patent: Mar. 13, 2018

(54) NONUNIFORM CORRUGATED DIAPHRAGM FOR MEMS TUNERS AND ACTUATORS

(71) Applicant: Purdue Research Foundation, West Lafayette, IN (US)

(72) Inventors: Juan Zeng, West Lafayette, IN (US); Zhengan Yang, West Lafayette, IN (US); Dimitrios Peroulis, West Lafayette, IN (US)

(73) Assignee: PURDUE RESEARCH FOUNDATION, West Lafayette, IN (US)

( * ) Notice: Subject to any disclaimer, the term of this patent is extended or adjusted under 35 U.S.C. 154(b) by 140 days.

(21) Appl. No.: 15/098,969

(22) Filed: Apr. 14, 2016

(65) Prior Publication Data

US 2016/0336922 A1    Nov. 17, 2016

Related U.S. Application Data

(60) Provisional application No. 62/147,111, filed on Apr. 14, 2015.

(51) Int. Cl.
| | |
|---|---|
| *H01P 7/06* | (2006.01) |
| *H01P 1/208* | (2006.01) |
| *H03J 3/02* | (2006.01) |
| *H01P 1/205* | (2006.01) |
| *H01H 59/00* | (2006.01) |
| *H03H 3/02* | (2006.01) |

(52) U.S. Cl.
CPC .............. *H01P 7/06* (2013.01); *H01H 59/00* (2013.01); *H01P 1/205* (2013.01); *H01P 1/208* (2013.01); *H01P 1/2053* (2013.01); *H01P 7/065* (2013.01); *H03J 3/02* (2013.01); *H03H 2003/027* (2013.01)

(58) Field of Classification Search
CPC .......... H01P 1/205; H01P 1/2053; H01P 7/06; H01P 1/208; H01P 7/065; H03H 2003/027; H03J 3/02
USPC ................................. 333/209, 227, 231–233
See application file for complete search history.

(56) References Cited

U.S. PATENT DOCUMENTS

| | | | | | |
|---|---|---|---|---|---|
| 2,409,321 | A | * | 10/1946 | Ingo ......................... | H01P 7/06 220/720 |
| 8,087,152 | B2 | * | 1/2012 | Kato ..................... | B81C 1/0038 29/594 |

(Continued)

OTHER PUBLICATIONS

Z. Yang and D. Peroulis, "A 23-35 GHz MEMS tunable all-silicon cavity filter with stability characterization up to 140 mllion cycles," in IEEE MTT-S International Microwave Symposium (IMS), Jun. 2014, pp. 1-4.

(Continued)

*Primary Examiner* — Rakesh Patel
(74) *Attorney, Agent, or Firm* — Purdue Research Foundation

(57) ABSTRACT

A cavity resonator tuning diaphragm comprising a plurality of inner corrugations, the plurality of inner corrugations having a first depth. An outer corrugation located between the plurality of inner corrugations and a perimeter of the diaphragm is also included, the outer corrugation having a second depth greater than the first depth. The addition of the outer deep corrugation provides increased thermal stability and reduced required actuation voltage.

10 Claims, 13 Drawing Sheets

(56) References Cited

U.S. PATENT DOCUMENTS

2011/0241802 A1* 10/2011 Joshi .................. H01P 1/219
333/209
2014/0022310 A1* 1/2014 Xie .................... B41J 2/1404
347/56

OTHER PUBLICATIONS

E. Naglich, M. Sinani, S. Moon, and D. Peroulis, "High-Q MEMS-tunable W-band bandstop resonators," in IEEE MTT-S International Microwave Symposium (IMS), June 2014, pp. 1-3.
Y. Shim, Z. Wu, and M. Rais-Zadeh, "A high-performance, temperaturestable, continuously tuned MEMS capacitor," in International Conference on Micro Electro Mechanical Systems (MEMS), Jan. 2011, pp. 752-755.
B. P. I. Reines and G. M. Rebeiz, "Thin-film aluminum RF MEMS switched capacitors with stress tolerance and temperature stability," J. Microelectromech. Syst, vol. 20, No. 1, Feb. 2011, pp. 193-203.
G. M. R. M. A. Philippine, O. Sigmund and T. W. Kenny, "Topology optimization of stressed capacitive RF MEMS switches," J. Microelectromech. Syst., vol. 22, No. 1, Feb. 2013, pp. 206-215.
J. C. B. T. P. Weihs, S. Hong and W. D. Nix, "Mechanical deflection of cantilever microbeams: A new technique for testing the mechanical properties of thin films," J. Mater. Res., vol. 3, Oct. 1988, pp. 931-942.

* cited by examiner

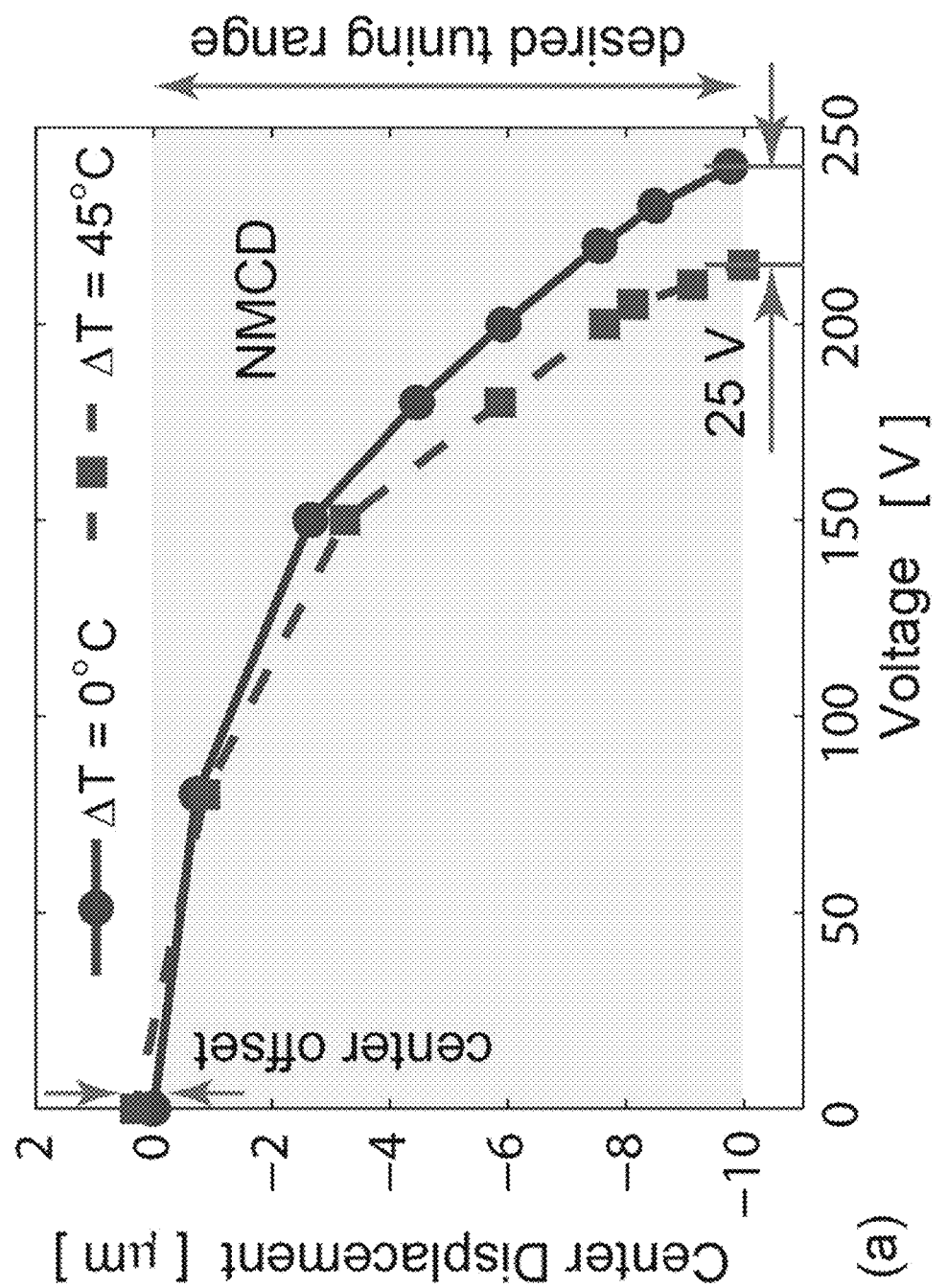

NONUNIFORM CORRUGATED DIAPHRAGM FOR MEMS TUNERS AND ACTUATORS

RELATED APPLICATIONS

The present patent application is related to and claims the priority benefit of U.S. Provisional Patent Application Ser. No. 62/147111, filed Apr. 14, 2015, the contents of which is hereby incorporated by reference in its entirety into the present disclosure.

TECHNICAL FIELD

The present application relates to micro-electrical-mechanical system (MEMS) tuners for resonators, filters, and actuators, and more specifically, to capacitive MEMS tuners and diaphragms.

BACKGROUND

Uniform micro-corrugated diaphragms (UMCDs) have been successfully demonstrated as MEMS tuners for evanescent-mode cavity resonators/filters with high tuning range and low tuning voltage. The micro-corrugated structure effectively relaxes stresses, and thus, reduces the sensitivity of the tuner's stiffness to stress and temperature. However, this stress reduction is accompanied by a vertical offset which is prominent especially under compressive stresses. In most practical cases, the residual stress becomes compressive at high temperatures due to the mismatch of the thermal coefficient of expansion (TCE) between the MEMS material and substrate. In one example, a temperature increase of 100° C. causes a ~15-µm offset which directly alters the frequency response of resonators/filters, and greatly reduces the tuning range. Therefore, improvements are needed in the field.

SUMMARY

According to one aspect of the present disclosure, an RF cavity resonator tuning diaphragm is disclosed, comprising an RF tuning diaphragm surface having a plurality of inner corrugations, the plurality of inner corrugations having a first depth, and an outer corrugation located between the plurality of inner corrugations and a perimeter of the diaphragm, the outer corrugation having a second depth greater than the first depth. The diaphragm may optionally be circular, with the inner corrugations and outer corrugation comprising concentric circles, and the inner corrugations having lateral radii smaller than a lateral radius of the outer corrugation. The diaphragm may also include a plurality of holes formed in the diaphragm.

According to another aspect, an RF resonator tuner is disclosed, comprising a diaphragm having a plurality of inner corrugations and an outer corrugation, the outer corrugation located between the plurality of inner corrugations and a perimeter of the diaphragm, the inner corrugations having a first depth smaller than a second depth of the outer corrugation. A mounting structure is connected to the perimeter of the diaphragm. An electrode is connected to the mounting structure and positioned near a back side of the diaphragm. A cavity is therefore defined by the back side of the diaphragm, the mounting structure, and the electrode.

According to another aspect, a MEMS RF cavity resonator is provided, comprising a diaphragm having a plurality of inner corrugations and an outer corrugation, the outer corrugation located between the plurality of inner corrugations and a perimeter of the diaphragm, the inner corrugations having a first depth smaller than a second depth of the outer corrugation, a first mounting structure connected to the perimeter of the diaphragm, an electrode connected to the first mounting structure and positioned near a back side of the diaphragm, a tuner cavity defined by the back side of the diaphragm, the first mounting structure, and the electrode, and a second mounting structure having a loading post, the second mounting structure connected to an outer portion of the first mounting structure 77 and defining a resonator cavity between a front side of the diaphragm and the second mounting structure, the second mounting structure further defining a gap between the front side of the diaphragm and the loading post. The cavity resonator may include a radio-frequency (RF) signal connector which extends into the resonator cavity and couples the signal present within the resonator cavity to an external circuit.

BRIEF DESCRIPTION OF THE DRAWINGS

In the following description and drawings, identical reference numerals have been used, where possible, to designate identical features that are common to the drawings.

FIG. 6a shows measured tuning displacement versus voltage curves for a capacitive tuner according to one embodiment.

The attached drawings are for purposes of illustration and are not necessarily to scale.

DETAILED DESCRIPTION

Micro-electrical-mechanical system (MEMS) devices are mentioned throughout this description and are understood to refer to device which have an overall size of less than 10 mm and as small as one micron.

The present disclosure provides a novel thermally-stable nonuniform micro-corrugated diaphragm (NMCD) designed for a capacitive MEMS tuner with a large continuous tuning displacement (>10 μm). The measured center offset is reduced by approximately 13.5× compared with the case of prior art uniform micro-corrugated diaphragms (UMCDs). Experimental results show that the enhanced thermal stability of a novel NMCD according to the present disclosure allows its operation in environments with large temperature variations.

Figure 1A:
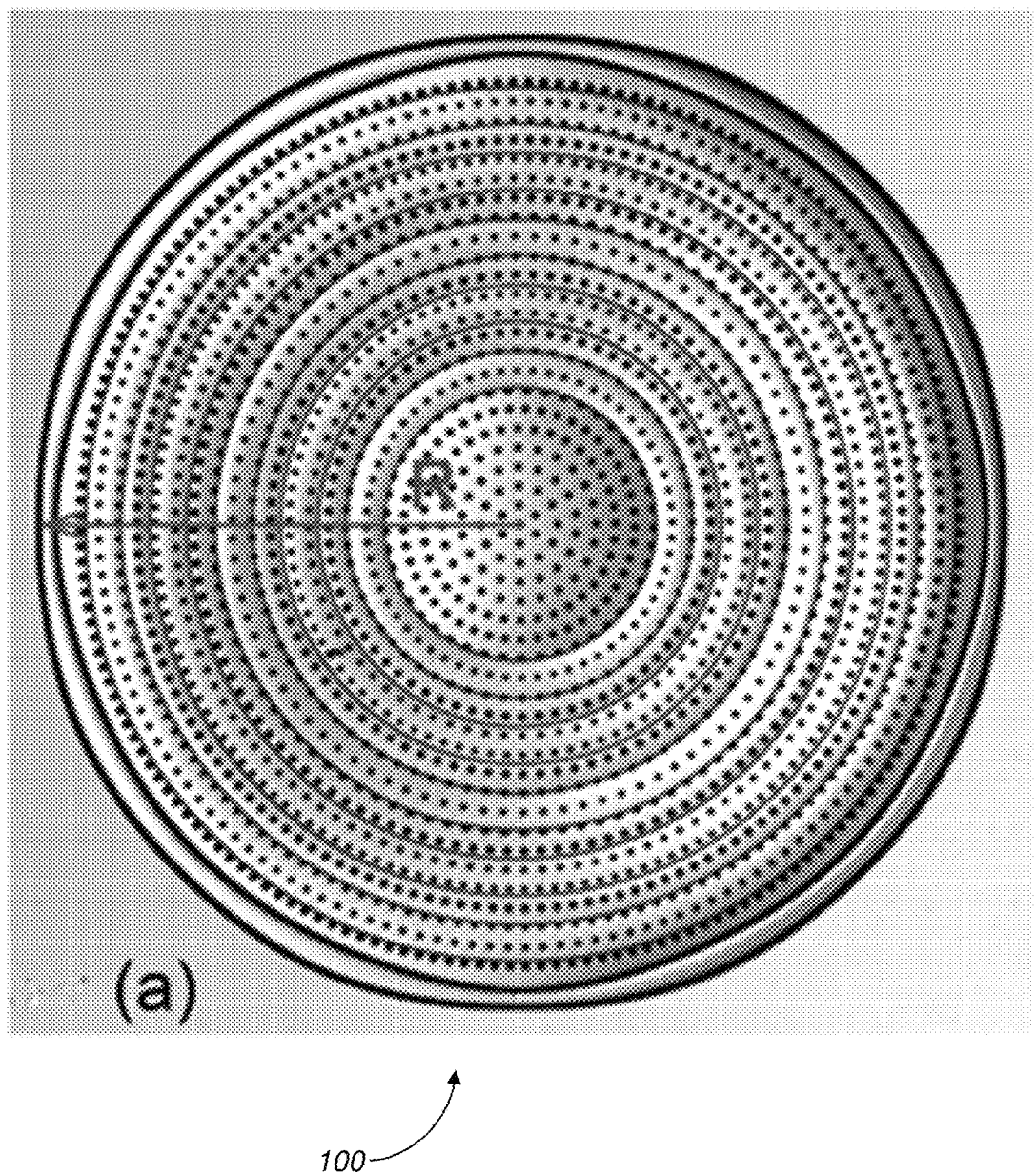
FIG. 1a is a microscopy view showing a top view of a tuner diaphragm according to one embodiment.
Figure 1B:
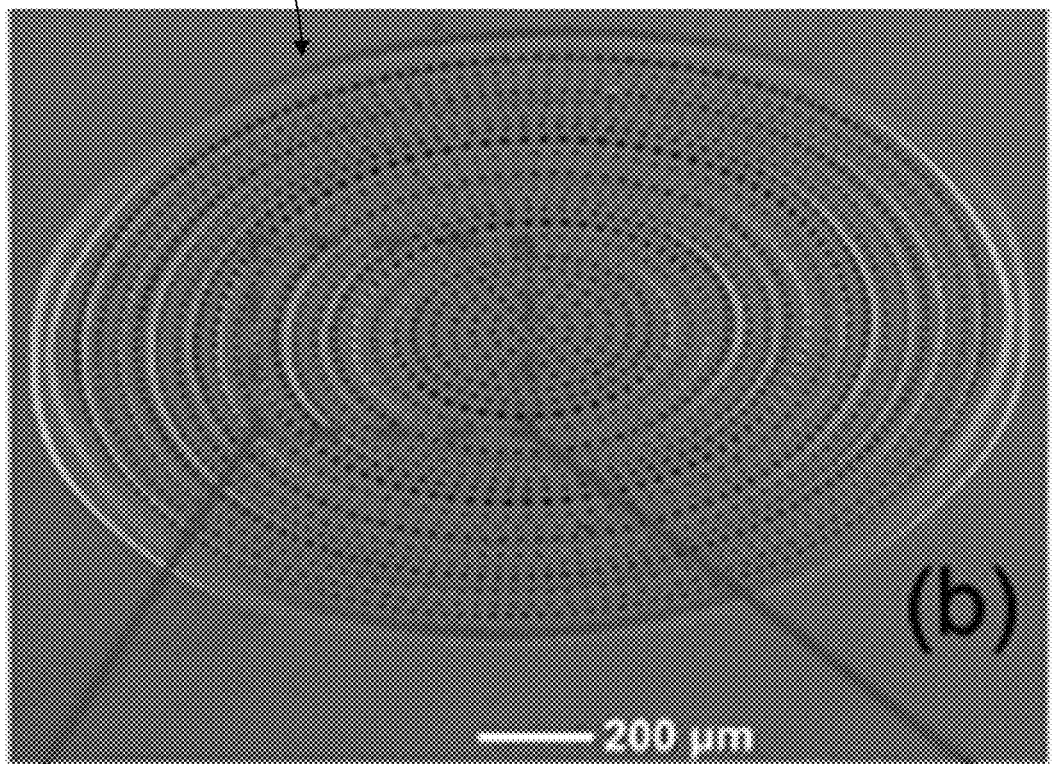
FIG. 1b is a scanning electron microscope (SEM) view showing a perspective view of a tuner diaphragm according to one embodiment.
Figure 1C:
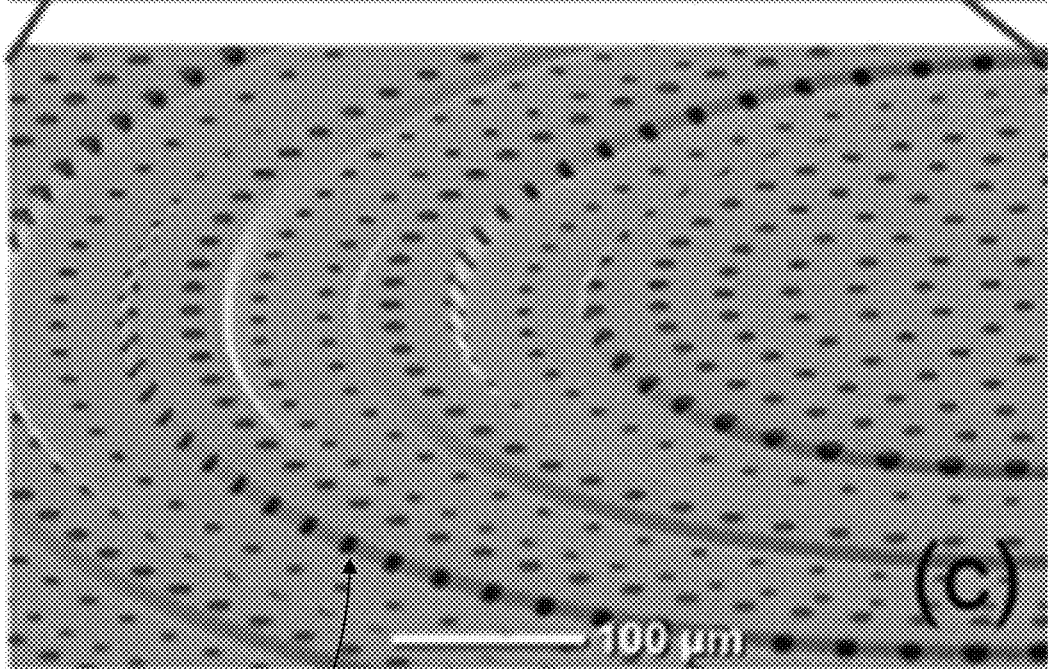
FIG. 1c is an enlargement of a portion of FIG. 1b.
Figure 1D:
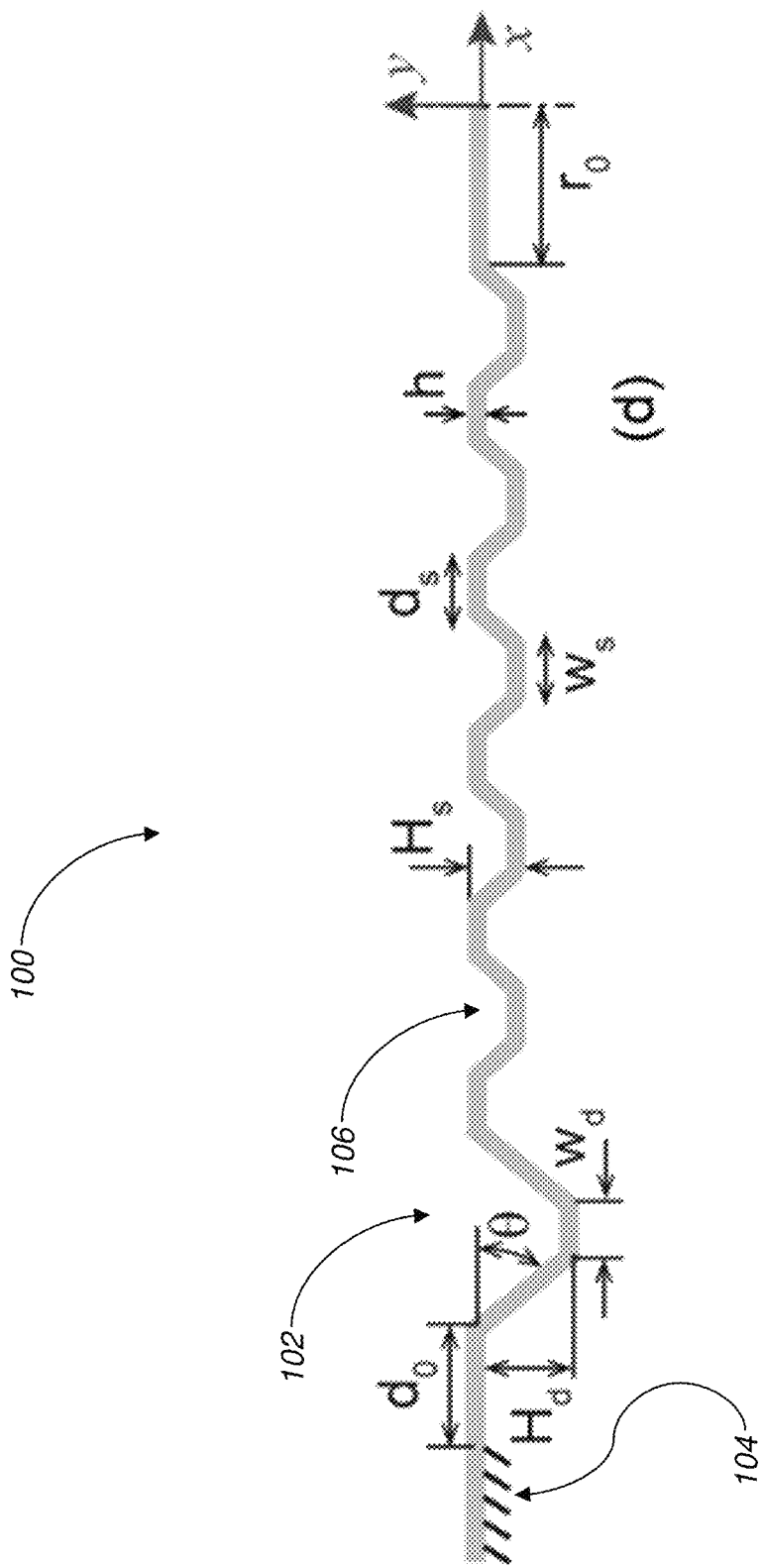
FIG. 1d is schematic cross-sectional view of half of the diaphragm of FIG. 1.

FIGS. 1a, 1b and 1c show microscopy images of a nonuniform micro-corrugated diaphragm 100 according to one embodiment of the present disclosure. As shown, the diaphragm has a plurality of perforations 101. FIG. 1d shows a axisymmetric cross-sectional view of the diaphragm 100 (with the axis y being the center of the diaphragm 100). The diaphragm 100 is illustrated as circular in shape, however other shapes may be used. Improved thermal stability is achieved by providing an outer deep corrugation 102 closest to the anchor 104 (outer perimeter) of the diaphragm 100, with the deep corrugation 102 being deeper than the inner shallow corrugations 106. The depth ($H_d$) of the deep corrugation 102 is selected by parameter optimization to generate an opposite temperature-induced offset to the offset caused by all the other uniform shallow corrugations 106, and consequently, minimizes the overall offset of the diaphragm 100. The diaphragm 100 is generally suitable for use in in the RF signal range, preferably 1 GHz and higher, and up to about 100 GHz, although frequencies greater than 100 GHz may be used. To optimize the dimensions of the first deep corrugation 102, finite-element (FE) simulations of the particular NMCD may be performed, for example by using ANSYS. In one example, the circular diaphragm 100 is made of a 1-μm-thick gold with a radius of R=900 μm. In the illustrated embodiment, there are five shallow uniform corrugations 106 designed for stress reduction with a corrugation depth of $H_s$=5 μm, and equal corrugation width and corrugation distance of $w_s$=$d_s$=55 μm. It shall be understood that the corrugation width $w_s$ and distance $d_s$ may be unequal, that more or less than five shallow corrugations 106 may be used, and that larger or smaller corrugation depth, width, and distance may also be used. A deep corrugation depth of $H_d$=15 μis employed in the illustrated embodiment. In certain embodiment, the deep corrugation depth $H_d$ is at least 1.5 times deeper than the shallow corrugation depth $H_s$. In other embodiments, the deep corrugation depth $H_d$ is at least 2 times deeper than the shallow corrugation depth H. In other embodiments, the deep corrugation depth $H_d$ is at least 3 times deeper than the shallow corrugation depth $H_s$. In the illustrated embodiment, the corrugation sidewalls are inclined with θ=45° as shown due to the etching process, although other angles may be used. The simulation of the illustrated embodiment assumes a Young's modulus of $E_0$=57 GPa and a Poisson's ratio of ν=0.42 for the gold diaphragm. The mismatch of thermal expansion coefficient (TCE) between the gold film and the silicon substrate is Δα=11.6 ppm.

In the illustrated embodiment, the diaphragm 100 is formed of gold, although other electrically conductive materials may also be used including, but not limited to, silver, copper, aluminum, or composite materials with high electrical conductivity.

Figure 2A:
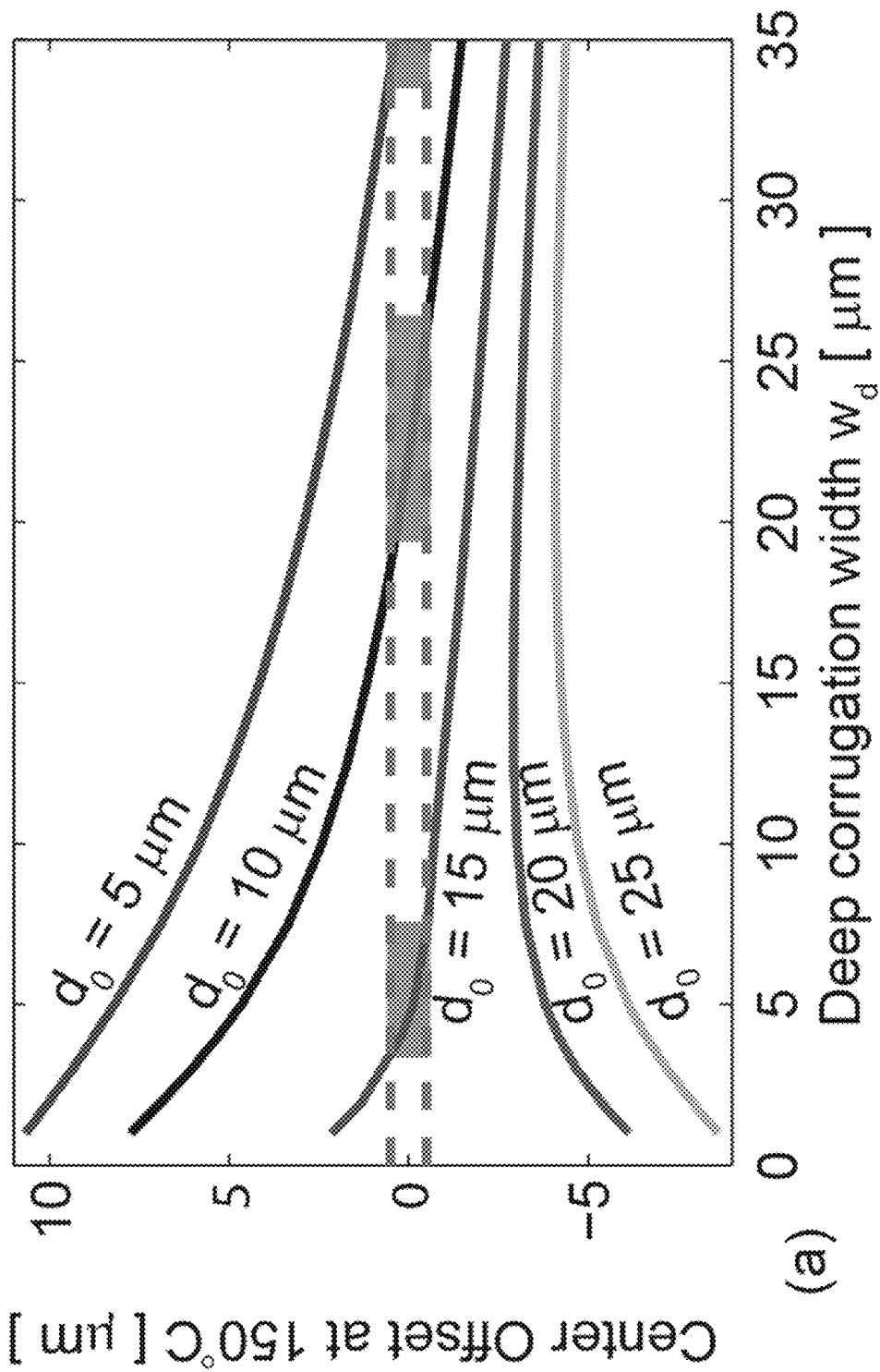
FIG. 2a shows a simulated center offset versus the outer (deep) corrugation width for various distances between the outer corrugation and the diaphragm perimeter at 150° C.
Figure 2B:
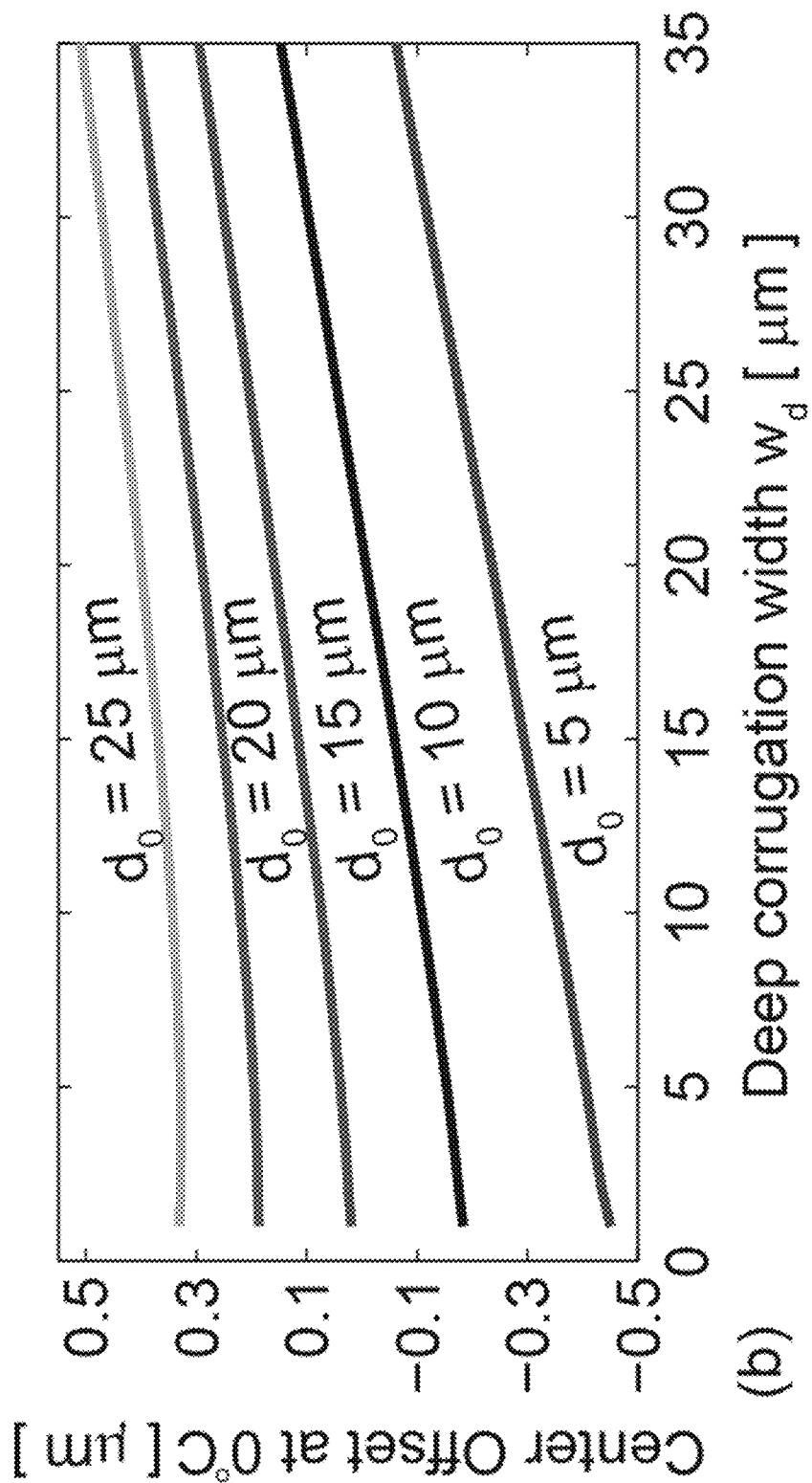
FIG. 2b shows a simulated center offset versus the outer (deep) corrugation width for various distances between the outer corrugation and the diaphragm perimeter at 0° C.
Figure 3A:
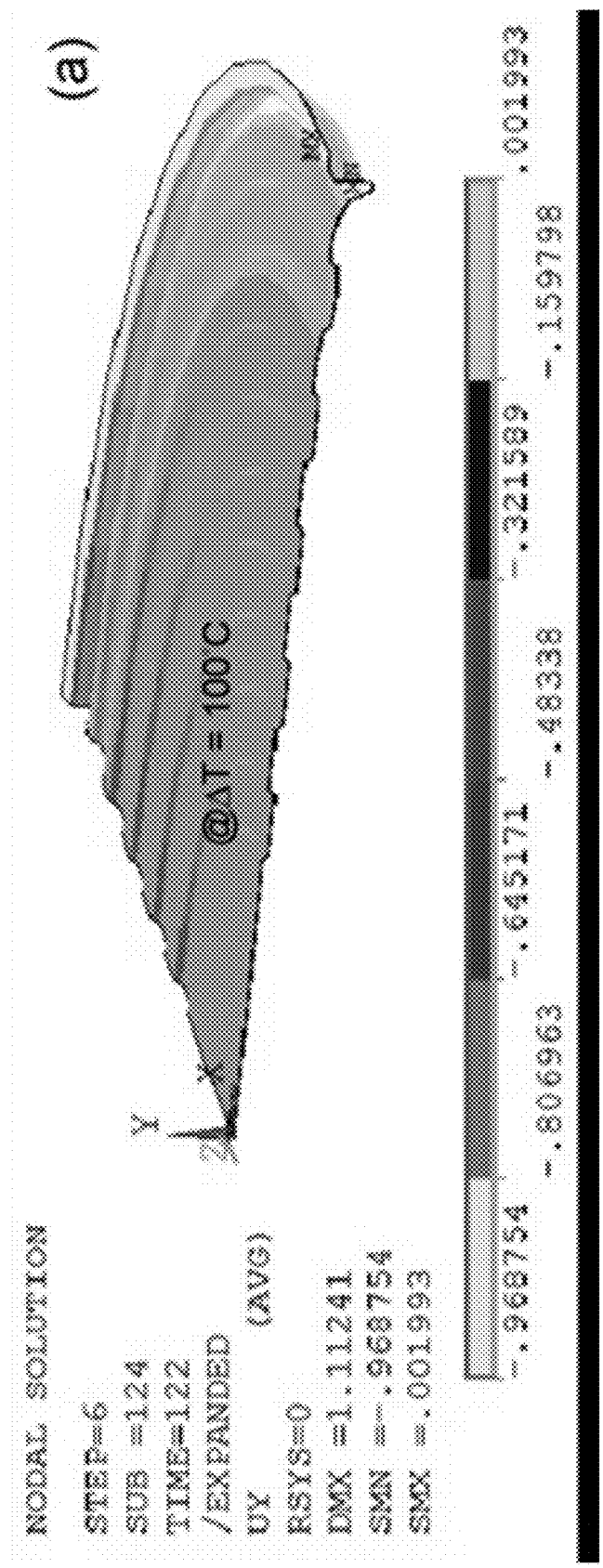
FIG. 3a shows a quarter-symmetry model of deformed shape of a nonuniform micro-corrugated diaphragm according to one embodiment.
Figure 3B:
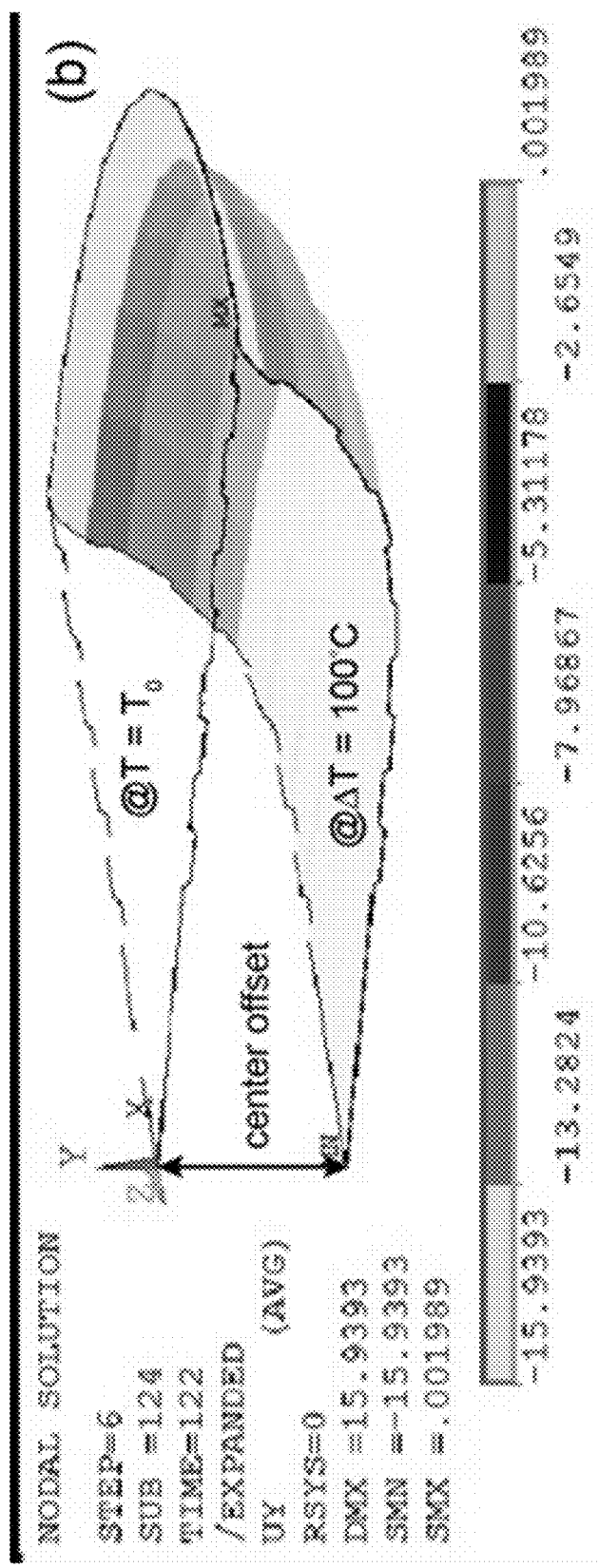
FIG. 3b shows a quarter-symmetry model of deformed shape of a prior art uniform micro-corrugated diaphragm.

Simulation results in FIGS. 2a and 2b show that the temperature-induced center offset can be minimized by the parameter optimization of the deep corrugation width ($w_d$) and the distance of the deep corrugation to the anchor ($d_0$) for the diaphragm 100. To constrain the offset within ±0.5 μm at both low temperature (0° C.) and high temperature (150° C.), the deep corrugation needs to be close enough to the anchor ($d_0$≤15 μm), and $w_d$ should be chosen from a range of optimal values (as shown by the shaded area in FIG. 2a) for a given value of $d_0$. In the example of FIG. 2a, for $d_0$>20 μm, the deformation from the deep corrugation 102 cannot fully compensate the offset caused by the other uniform corrugations 106. In the illustrated embodiment, the distance $d_0$=15 μm is chosen to guarantee that the deep corrugation 102 can be fully released during the fabrication and to minimize the fabrication error percentage. Thus, any value of $w_d$ between 3.5 μm and 7 μm meets the design constraints of center offsets, and a mean value of $w_d$=5 μm is selected to maximize the design margin. The simulated shapes of NMCD 100 (FIG. 3a) and a prior-art UMCD (FIG. 3b) intuitively show that the NMCD 100 is more stable than a comparable UMCD under a large temperature variation. The deformation results illustrated in FIGS. 3a and 3b are magnified by five times. However, as can be seen, the deformation of the NMCD 100 is greatly reduced when compared to the UMCD.

Figures 4A, 4B, 4C, 4D:
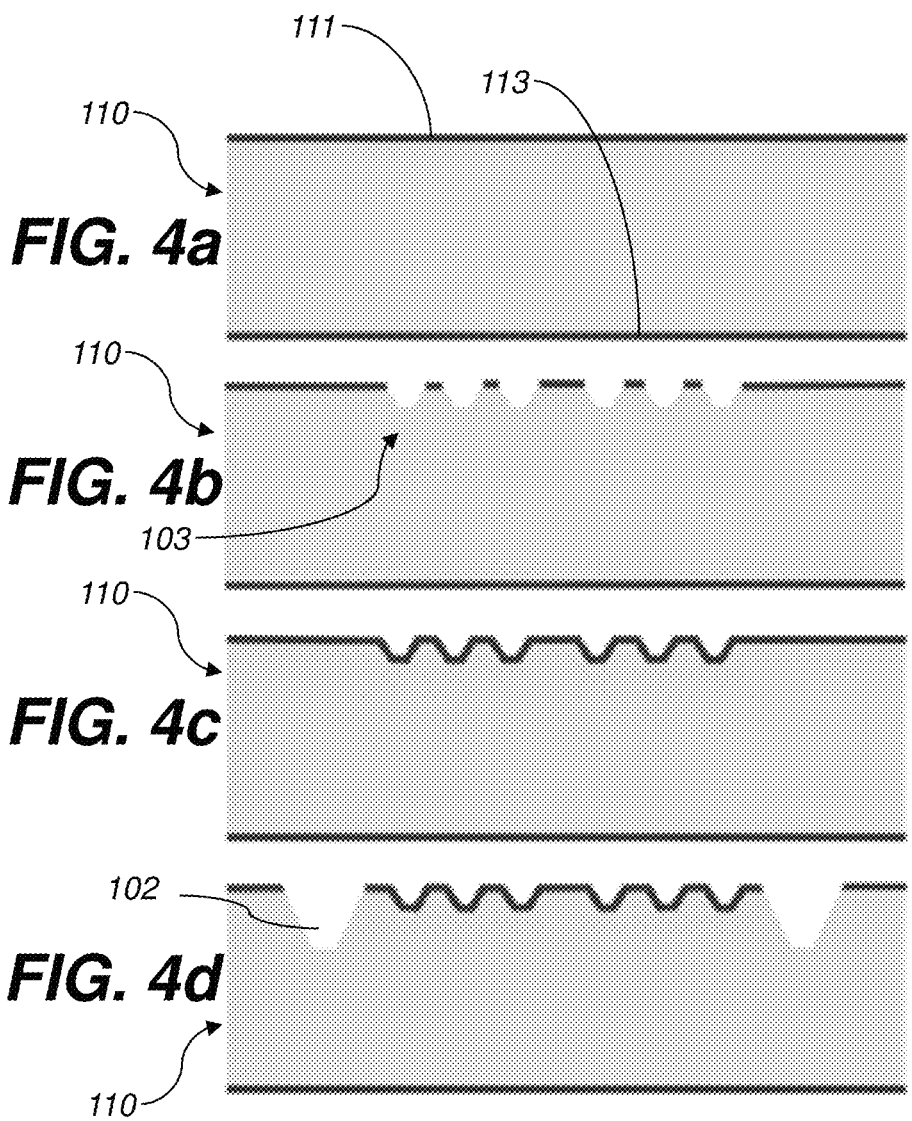
FIGS. 4a illustrates a first step of a process for fabricating a tuner diaphragm according to one embodiment.
FIG. 4b illustrates a second step of a process for fabricating a tuner diaphragm according to one embodiment.
FIG. 4c illustrates a third step of a process for fabricating a tuner diaphragm according to one embodiment.
FIG. 4d illustrates a fourth step of a process for fabricating a tuner diaphragm according to one embodiment.
Figure 4E:
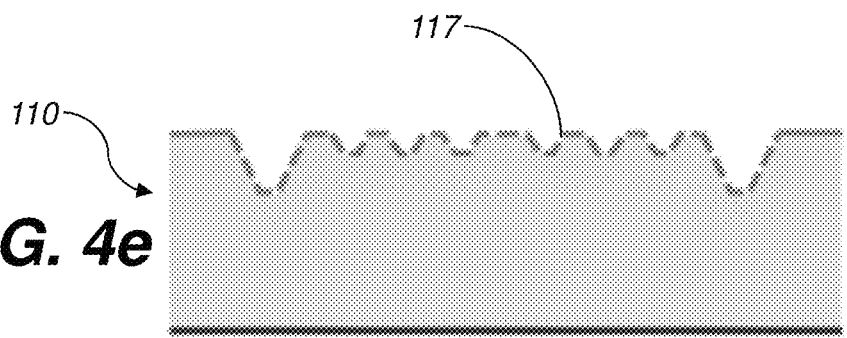
FIG. 4e illustrates a fifth step of a process for fabricating a tuner diaphragm according to one embodiment.
Figure 4F:
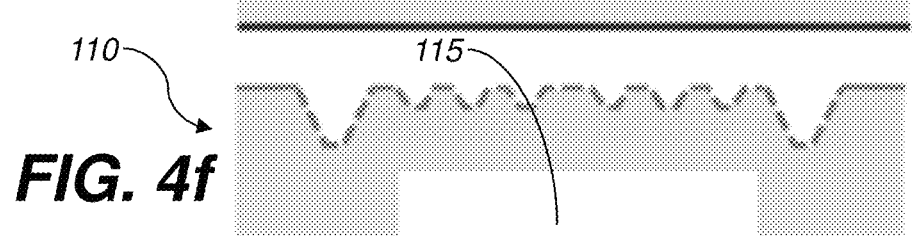
FIG. 4f illustrates a sixth step of a process for fabricating a tuner diaphragm according to one embodiment.
Figure 4G:
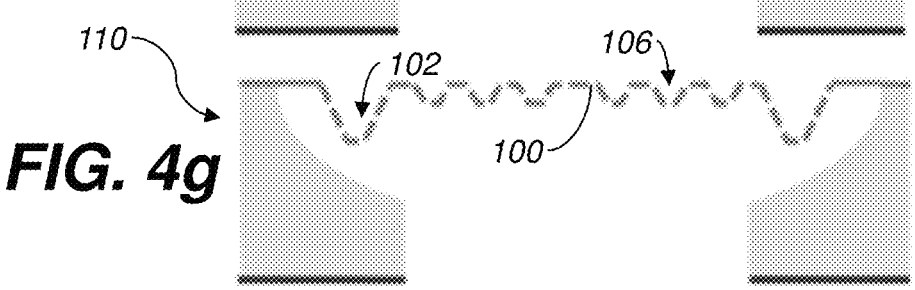
FIG. 4g illustrates a seventh step of a process for fabricating a tuner diaphragm according to one embodiment.
Figure 4H:
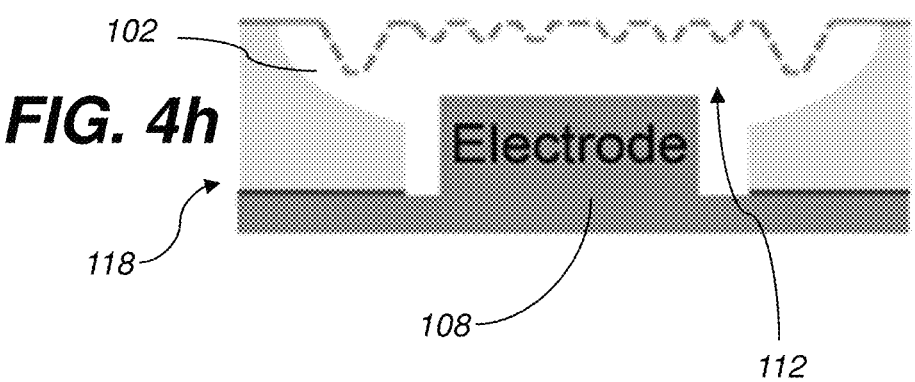
FIG. 4h illustrates an eighth step of a process for fabricating a tuner diaphragm according to one embodiment.

According to one embodiment, a fabrication process is shown in FIGS. 4a-4h for fabricating the diaphragm 100 as part of a tuner 118. The process starts with a 300-μm-thick double-side-polished and oxidized silicon substrate 110 having top and bottom oxide layers 111 and 113 respectively (FIG. 4a). Next, the top oxide layer 111 is first patterned (e.g., using buffered oxide solution (BOE)) and a 5-μm uniform shallow inner corrugation profile 103 is defined by TMAH etching as shown in FIG. 4b. After thermal oxidation (FIG. 4c), a 15-μm deep outer corrugation (similar to corrugation 102) is etched (FIG. 4d). Buffered-oxide-etching removes the top oxide layer 111 and then sputtering a 1-μm-thick gold layer forms the diaphragm 100 with the shape of corrugations 102 and 106 transferred from the silicon substrate 110 (FIG. 4e). The releasing holes 101 are patterned on the diaphragm area as also shown in FIG. 4e. The releasing holes 101 are designed to ensure the dry release process (XeF2 etch) residual free of substrate material, and to maintain the circular shape of diaphragm 100. The density of the release holes 101 determines the air damping factor for mechanical tuning performance, which may be tailored to a desired value for the particular application. Backside (from bottom in figures) silicon deep reactive ion etching (DRIE) is then performed to create a tunnel 115 for insertion of an electrically-conductive bias electrode 108. DRIE is stopped with a thin layer of silicon remaining under the gold film (FIG. 4f. The diaphragm 100 is released using XeF2 to remove the remaining thin layer of silicon underneath the center of the diaphragm 100. The diaphragm 100 is anchored to the silicon substrate 110 at its perimeter as shown in FIG. 4g. During the last step, the backside electrode 108, which is one embodiment is made of a gold-coated silicon piece with a DRIE etched post, is inserted into the tunnel 115 and attached to the substrate 110 as shown in FIG. 4h. With the process complete, the diaphragm 100, silicon substrate 110, and electrode 108 form an interior cavity 112. The dimensions of the cavity 112 may also be chosen to achieve the desired tuning of the diaphragm 100 depending on the needs of the particular application. An external voltage source (not shown) is connected across the electrode 108 and diaphragm 100 to apply a bias voltage.

Measurement Results: The center offsets with respect to the initial position of the diaphragms at room temperature ($T_0=22°$ C.) were measured using a confocal microscope with a temperature variation up to $\Delta T=100°$ C. The UMCD and NMCD 100 were placed on a ceramic micro-hotplate at the same time for temperature control. When temperature was increased from $T_0=22°$ C., the center offset was recorded using the confocal microscope.

Figure 5:
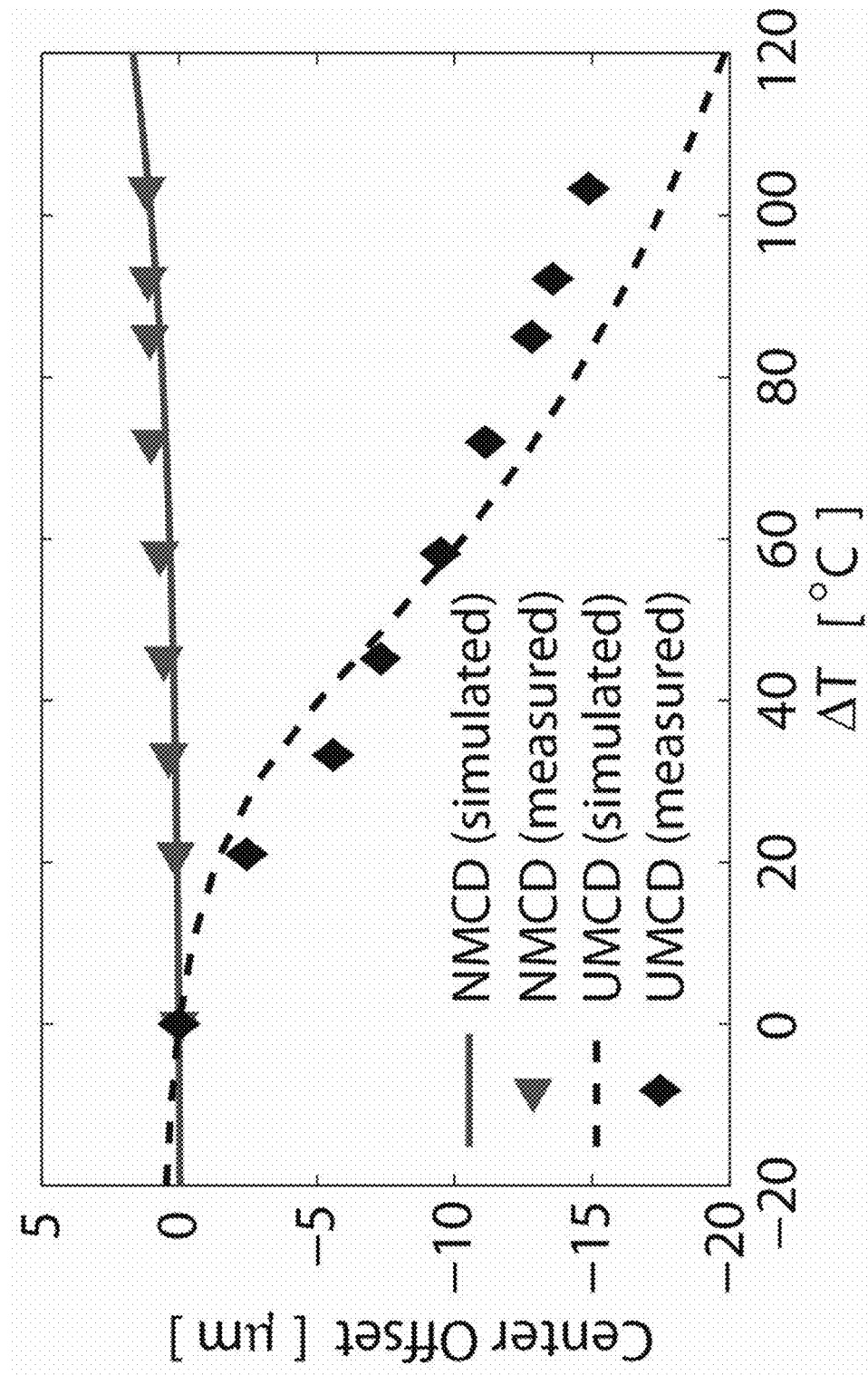
FIG. 5 shows simulated and measured center offsets for a tuner diaphragm according to one embodiment as compared to a prior art diaphragms.

The results of the temperature-induced center offset for NMCD and UMCD are compared to ANSYS simulations as plotted in FIG. 5. With a temperature variation of $\Delta T=100°$ C., the UMCD has a measured downward center offset about 14.9 μm, while the NMCD 100 shows an improvement of 13.5× with an upward center offset around 1.1 μm. The upward offset of the NMCD 100 could be caused by fabrication variations. By taking into account the fabrication variations using $d_0=13.5$ μm and $h=1.05$ μm, the simulation results show a good agreement to the measurements. Therefore, the deep corrugation 102 with optimized dimensions in NMCD 100 effectively reduces the temperature-induced offset or, in other words, greatly increases the stability of the diaphragm's center position and thus the stability of the resonator/filter's frequency in an environment with a large temperature variation.

Figure 7:
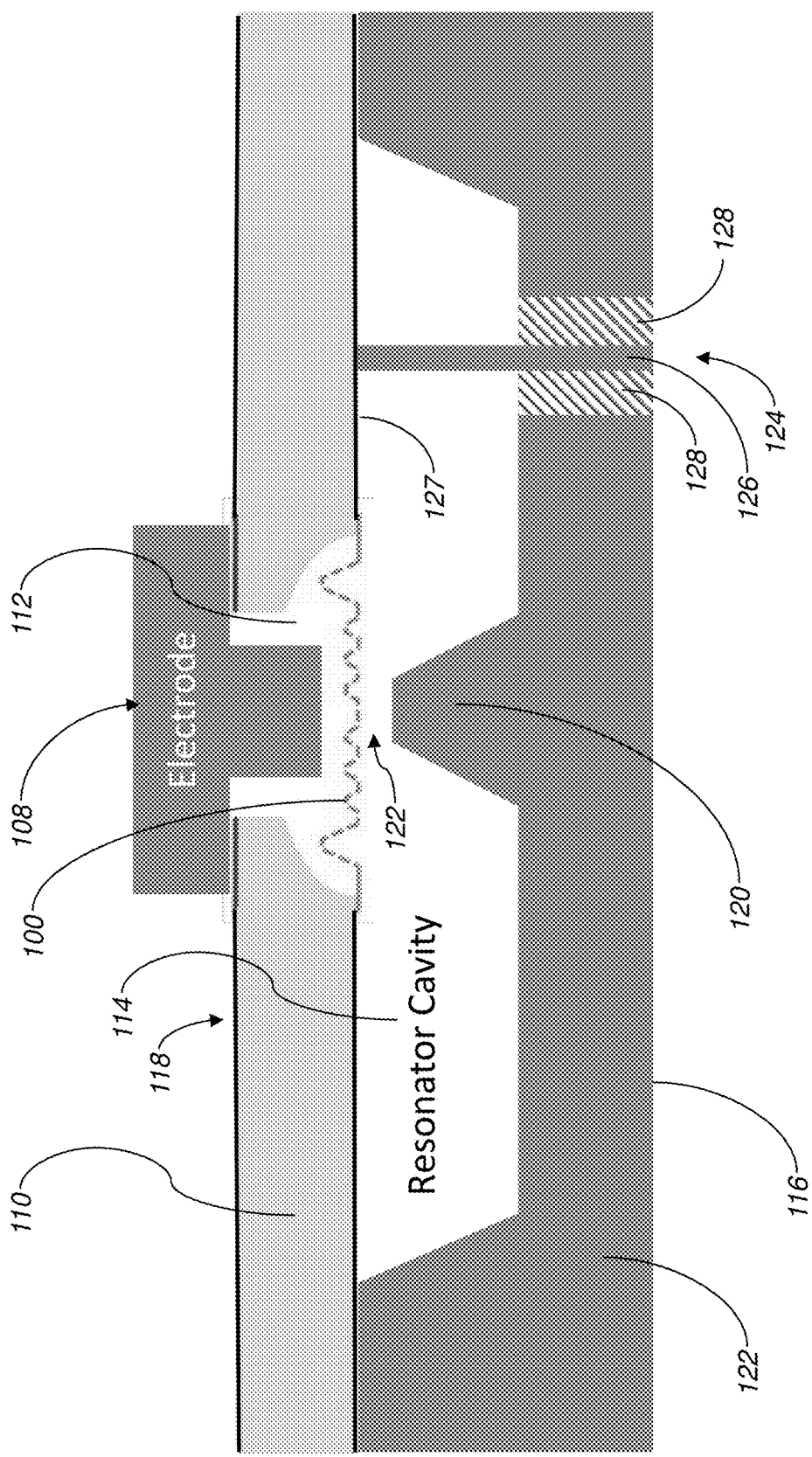
FIG. 7 shows a schematic diagram of a cavity resonator incorporating a diaphragm according to one embodiment.

FIG. 7 shows a cavity resonator 116 which incorporates the MEMS tuner 118 according to one embodiment. When the MEMS tuner 118 is assembled into the cavity resonator 116 (having a resonator cavity 114) as shown in FIG. 7, the center of the diaphragm 100 is aligned with a loading post 120 in the cavity 114 and the resonator 116 is calibrated with respect to the initial position of the diaphragm 100 at $T=T_0$. A RF signal connection 124 may also be provided to couple the RF signal inside the cavity 114 to an external circuit. In one embodiment, the connection 124 comprises a coaxial connector having a center conductor 126 and a concentric dielectric 128 as shown. The center conductor extends into the cavity 114 and may optionally make electrical contact with surface 127 (which is electrically connected to the diaphragm 100) or may simply float within the cavity 114. The loading post and adjacent mounting structure 122 may be formed from any organic or inorganic structural material coated with an electrically conductive film, such that the cavity 114 is at least partially enclosed by conductive material (although there may be breaks in the conductive film, e.g., the dielectric 128 surrounding center conductor 126). Possible structural materials for the loading post 120 and structure 122 include, but are not limited to, silicon, glass, quartz, photo-resist, and plastic. Possible materials for the electrically conductive film of the loading post and structure 122 include, but are not limited to, gold, silver, copper, aluminum, or composite materials with high electrical conductivity.

To achieve frequency tuning, the MEMS tuner 118 is electrostatically actuated to change the gap 122 between the loading post 120 and the diaphragm 100. Since the electrostatic force can only pull the diaphragm 100 downwards (towards the electrode 108), an upward offset can be compensated by an additional bias voltage, while a downward offset cannot. As discussed above, prior art UMCDs always have large downward offsets at high temperatures. For the novel diaphragm 100 of the present disclosure, the fabrication variations will cause a small offset, and the offset is upward with a smaller distance $d_0$ and a larger thickness h compared to the design values. The distance $d_0$ is affected by the silicon etching step which defines the diaphragm boundary. Therefore, it is important to avoid over etching to prevent undesirable downward offsets.

As shown in FIG. 6a, the displacement of the NMCD 100 changes continuously as the actuation voltage increases, and the voltage required for a 10-μm tuning displacement is 240 V at the room temperature ($T=T_0$). With a temperature increase of $\Delta T=45°$ C., its center position shifts upwards by 0.3 μm (also shown in FIG. 5). This small upward offset can be compensated by a small bias voltage and therefore the NMCD 100 can still be tuned over the entire desired tuning range. As temperature increases, the residual stress in the diaphragm 100 becomes more compressive which leads to a reduced diaphragm stiffness. Thus, the NMCD 100 now requires 215 V to reach a 10-μm tuning displacement, which decreases by 10.4%.

Figure 6B:
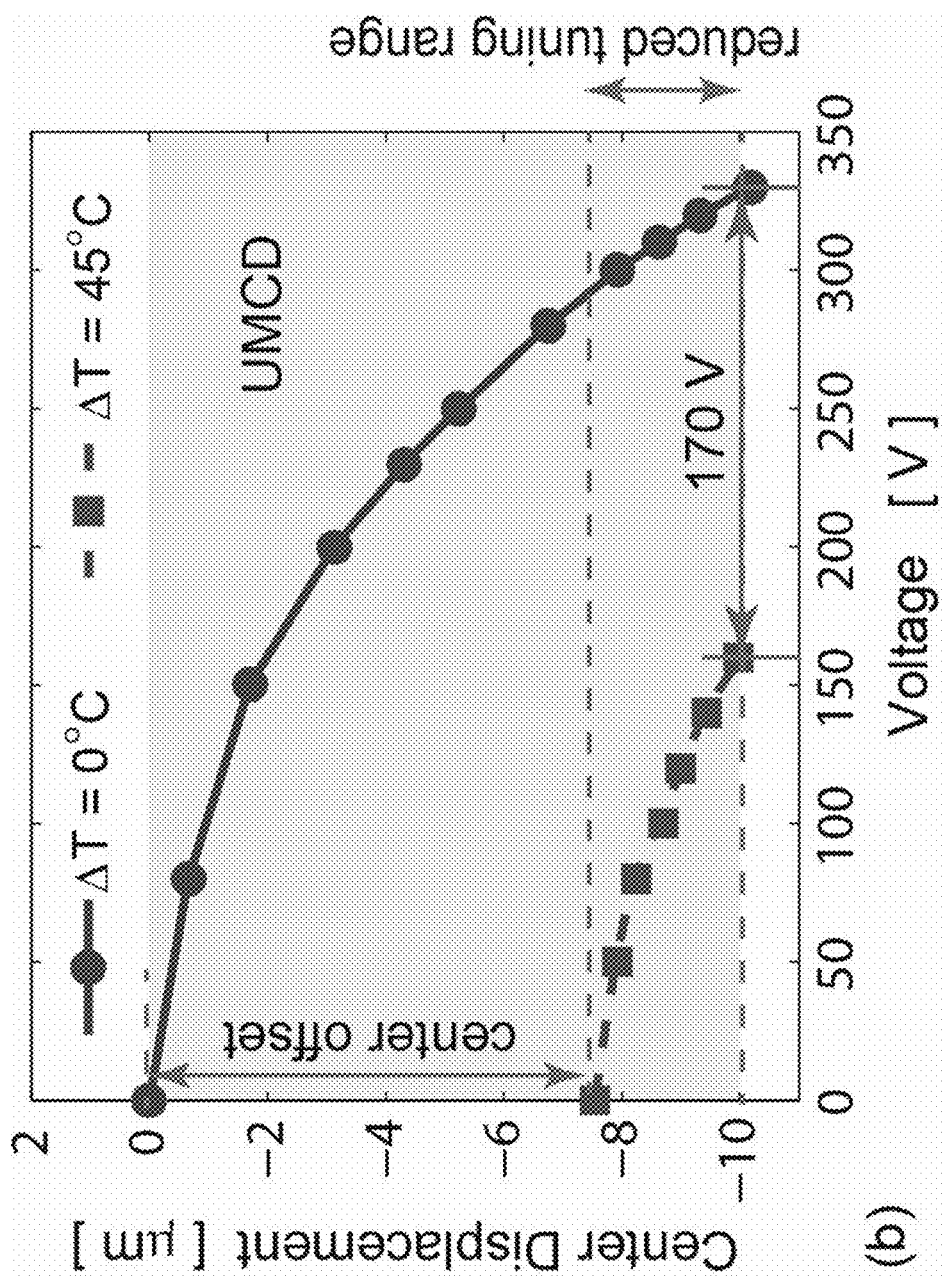
FIG. 6b shows measured tuning displacement versus voltage curves for a prior art capacitive tuner with only uniform corrugations.

For comparison, a MEMS tuner with a UMCD is also measured as shown in FIG. 6b At $\Delta T=45°$ C., the UMCD has a downward center offset of 7.5 μm. This downward offset cannot be compensated by the bias voltage and thus greatly reduces the tuning range by 75% compared with the desired range. If the temperature further increases, the diaphragm deforms out of the desired range which results in the resonator's failure of operation in the desired frequency range. In addition, the required voltage to tune the UMCD to a 10-μm displacement (with respect to the initial position at $T=T_0$) changes by 51.5% from 330 V (at $T=T_0$) to 160 V (at $\Delta T=45°$ C.).

Steps of various methods described herein can be performed in any order except when otherwise specified, or when data from an earlier step is used in a later step. Exemplary method(s) described herein are not limited to being carried out by components particularly identified in discussions of those methods.

It shall be understood that while the above description illustrates the diaphragm 100 incorporated within a tunable device, the diaphragm 100 may be utilized within static devices as well, where stability over varying temperatures is desired.

The invention is inclusive of combinations of the aspects described herein. References to "a particular aspect" (or "embodiment" or "version") and the like refer to features that are present in at least one aspect of the invention. Separate references to "an aspect" (or "embodiment") or "particular aspects" or the like do not necessarily refer to the same aspect or aspects; however, such aspects are not mutually exclusive, unless otherwise explicitly noted. The use of singular or plural in referring to "method" or "methods" and the like is not limiting. The word "or" is used in this disclosure in a non-exclusive sense, unless otherwise explicitly noted.

The invention has been described in detail with particular reference to certain preferred aspects thereof, but it will be understood that variations, combinations, and modifications can be effected within the spirit and scope of the invention.

The invention claimed is:
1. A MEMS RF cavity resonator, comprising:
   a diaphragm having a plurality of inner corrugations and an outer corrugation, the outer corrugation located between the plurality of inner corrugations and a perim- eter of the diaphragm, the inner corrugations having a first depth smaller than a second depth of the outer corrugation;

a first mounting structure connected to the perimeter of the diaphragm;

an electrode connected to the first mounting structure and positioned near a back side of the diaphragm;

a tuner cavity defined by the back side of the diaphragm, the first mounting structure, and the electrode;

a second mounting structure having a loading post, the second mounting structure connected to an outer portion of the first mounting structure and defining a resonator cavity between a front side of the diaphragm and the second mounting structure, the second mounting structure further defining a gap between the front side of the diaphragm and the loading post and at least a portion of the electrode extends into the tuner cavity.

2. The MEMS RF cavity resonator of claim 1, wherein the first mounting structure comprises silicon.

3. The MEMS RF cavity resonator of claim 1, further comprising a plurality of holes formed in the diaphragm.

4. The MEMS RF cavity resonator of claim 1, wherein the diaphragm has a radius less than 5000 µm.

5. The MEMS RF cavity resonator of claim 1, wherein the diaphragm comprises gold.

6. The MEMS RF cavity resonator of claim 1, further comprising:

an RF signal connector having an RF conductor, the conductor extending into the resonator cavity.

7. The MEMS RF cavity resonator of claim 6, wherein the RF signal connector further comprises a dielectric disposed between the second mounting structure and the RF conductor.

8. The MEMS RF cavity resonator of claim 7, wherein the RF signal connector comprises a coaxial connector.

9. The MEMS RF cavity resonator of claim 6, wherein the RF signal connector is electrically connected to an interior conductive surface of the resonator cavity.

10. The MEMS RF cavity resonator of claim 1, wherein an interior surface of the resonator cavity comprises an electrically conductive material and is electrically connected to the diaphragm.

* * * * *